(12) United States Patent
Andrews et al.

(10) Patent No.: US 10,365,323 B2
(45) Date of Patent: Jul. 30, 2019

(54) PROBE SYSTEMS AND METHODS FOR AUTOMATICALLY MAINTAINING ALIGNMENT BETWEEN A PROBE AND A DEVICE UNDER TEST DURING A TEMPERATURE CHANGE

(71) Applicant: Cascade Microtech, Inc., Beaverton, OR (US)

(72) Inventors: Peter Douglas Andrews, Beaverton, OR (US); David Michael Newton, Beaverton, OR (US); David Randle Hess, Beaverton, OR (US)

(73) Assignee: FormFactor Beaverton, Inc., Beaverton, OR (US)

( * ) Notice: Subject to any disclaimer, the term of this patent is extended or adjusted under 35 U.S.C. 154(b) by 347 days.

(21) Appl. No.: 15/339,419

(22) Filed: Oct. 31, 2016

(65) Prior Publication Data

US 2017/0146594 A1 May 25, 2017

Related U.S. Application Data

(60) Provisional application No. 62/259,814, filed on Nov. 25, 2015.

(51) Int. Cl.
*G01R 31/28* (2006.01)
(52) U.S. Cl.
CPC ..... *G01R 31/2891* (2013.01); *G01R 31/2874* (2013.01)
(58) Field of Classification Search
CPC .. G01R 1/06738; G01R 1/06772; G01R 3/00; G01R 1/06766; G01R 1/07342; G01R 1/073; G01R 31/2889; G01R 31/2891; G01R 1/06727; G01R 31/02; G01R 31/2887; G01R 35/005; G01R 1/0491; G01R 1/07314; G01R 1/07371; G01R 31/3025; G01R 35/00; G01R 1/06716;

(Continued)

(56) References Cited

U.S. PATENT DOCUMENTS

| 5,644,245 A * | 7/1997 | Saitoh | G01R 1/06794 |
|---|---|---|---|
| | | | 324/750.18 |
| 7,501,843 B2 * | 3/2009 | Takahashi | G01R 31/2891 |
| | | | 324/750.19 |

(Continued)

*Primary Examiner* — Vinh P Nguyen
(74) *Attorney, Agent, or Firm* — Dascenzo Intellectual Property Law, P.C.

(57) ABSTRACT

Probe systems and methods for automatically maintaining alignment between a probe and a device under test (DUT) during a temperature change. The methods include collecting an initial image of a planar offset fiducial and determining an initial height reference of a height offset fiducial. The methods further include changing a temperature of the DUT, automatically maintaining a planar alignment between a probe and the DUT during the changing, and automatically maintaining a height alignment between the probe and the BUT during the changing. The probe systems include a chuck, which defines a support surface configured to support a substrate that includes the DUT, and a probe head assembly, which includes a probe configured to contact a corresponding contact pad of the DUT. The probe systems further include a substrate thermal module, which is configured to regulate a temperature of the DUT, and a controller programmed to execute the methods.

20 Claims, 3 Drawing Sheets

(58) Field of Classification Search
CPC .............. G01R 1/0735; G01R 31/2831; G01R 31/2874; G06F 17/5068; G01N 23/046; G11C 2029/5602
See application file for complete search history.

(56) References Cited

U.S. PATENT DOCUMENTS

| | | | |
|---|---|---|---|
| 7,825,675 | B2 | 11/2010 | Breinlinger |
| 8,013,621 | B2 * | 9/2011 | Sano .................. G01R 31/2891 324/750.16 |
| 8,345,951 | B2 * | 1/2013 | Sato ........................ G06T 7/136 324/750.18 |
| 8,493,083 | B2 * | 7/2013 | Kiyokawa .......... G01R 31/2891 324/750.16 |
| 8,587,331 | B2 | 11/2013 | Berry et al. |
| 2007/0013401 | A1 | 1/2007 | Khandros et al. |
| 2007/0216431 | A1 | 9/2007 | Tunaboylu et al. |
| 2007/0229098 | A1 | 10/2007 | Kobayashi et al. |
| 2010/0134127 | A1 | 6/2010 | Breinlinger et al. |
| 2010/0213960 | A1 | 8/2010 | Mok et al. |

\* cited by examiner

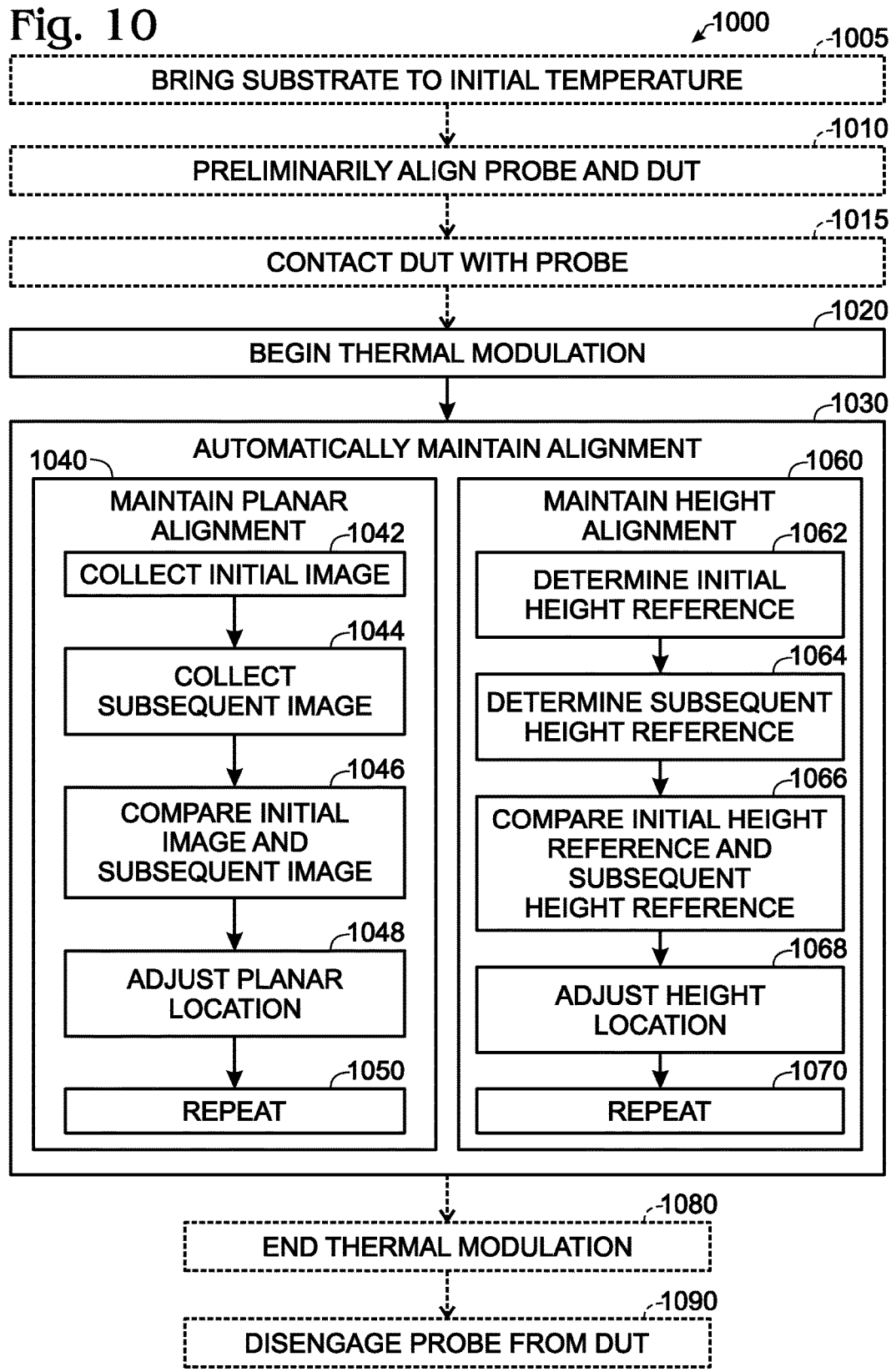

PROBE SYSTEMS AND METHODS FOR AUTOMATICALLY MAINTAINING ALIGNMENT BETWEEN A PROBE AND A DEVICE UNDER TEST DURING A TEMPERATURE CHANGE

RELATED APPLICATION

This application claims priority to U.S. Provisional Patent Application No. 62/259,814, which was filed on Nov. 25, 2015, and the complete disclosure of which is hereby incorporated by reference.

FIELD OF THE DISCLOSURE

The present disclosure relates generally to probe systems and methods for automatically maintaining alignment between a probe and a device under test during a temperature change.

BACKGROUND OF THE DISCLOSURE

Probe systems may be utilized to test the operation of integrated circuit devices over a range of different test conditions. This may include tests that are performed at low temperatures, tests that are performed at elevated temperatures, and/or tests that are performed under controlled atmospheric conditions. As an example, wafer-level reliability measurements may be performed over a temperature range of several hundred degrees Celsius.

Wafers generally include a plurality of spaced-apart integrated circuit devices, which may be arranged on separate die. When wafer-level measurements are performed on an integrated circuit device, it may be desirable to continuously perform tests on the integrated circuit device over a range of temperatures. These tests may require that a probe system utilized to test the integrated circuit device be configured to maintain an alignment between a probe, which is associated with the probe system, and a contact pad, which is associated with the integrated circuit device, over the range of temperatures.

As test conditions are changed, the relative orientation of the probe and the contact pad may vary. As an example, thermal expansion and/or contraction experienced by the probe system and/or by the wafer may cause such orientation changes. Historically, contact pads have been made sufficiently large to accommodate these orientation changes and/or to allow for a continuous manual adjustment of the relative orientation; however, these larger contact pads increase the cost of manufacturing the integrated circuit devices and/or decrease a packing density of the integrated circuit devices on the wafer. In addition, manual adjustment may be time-consuming, expensive, and/or inaccurate. Thus, there exists a need for probe systems and methods for automatically maintaining alignment between a probe and a device under test during a temperature change.

SUMMARY OF THE DISCLOSURE

Probe systems and methods for automatically maintaining alignment between a probe and a device under test (DUT) during a temperature change are disclosed herein. The methods include collecting an initial image of a planar offset fiducial and determining an initial height reference of a height offset fiducial. The methods further include changing a temperature of the DUT from a first DUT temperature to a second DUT temperature. The methods also include automatically maintaining a planar alignment between a probe and the DUT during the changing and automatically maintaining a height alignment between the probe and the DUT during the changing. The automatically maintaining the planar alignment includes automatically and repeatedly collecting a subsequent image of the planar offset fiducial, comparing the initial image and the subsequent image to determine a planar offset of the planar offset fiducial, and adjusting a planar location of the probe and/or of the DUT to maintain the planar alignment. The automatically maintaining the height alignment includes automatically and repeatedly determining a subsequent height reference of the height offset fiducial, c wing the initial height reference and the subsequent height reference to determine a height offset of the height offset fiducial, and adjusting a height location of the probe and/or of the DUT to maintain the height alignment.

The probe systems include a chuck, which defines a support surface configured to support a substrate that includes the DUT, and a probe head assembly, which includes a probe configured to contact a corresponding contact pad of the DUT. The probe systems further include a substrate thermal module, which is configured to regulate a temperature of the DUT, and a controller programmed to execute the methods.

BRIEF DESCRIPTION OF THE DRAWINGS

FIG. 10 is a flowchart depicting methods, according to the present disclosure, of maintaining alignment between a probe of a probe head assembly and a contact pad of a device under test.

DETAILED DESCRIPTION AND BEST MODE OF THE DISCLOSURE

Figure 1:
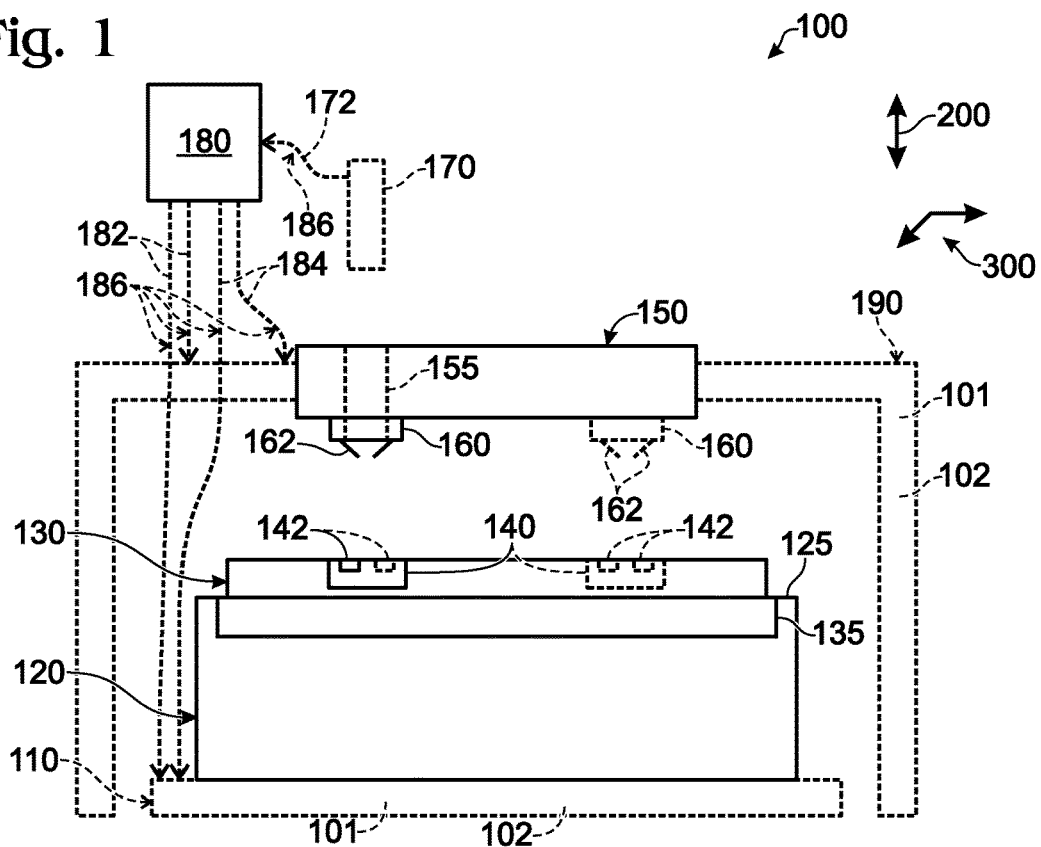
FIG. 1 is a schematic representation of examples of a probe system according to the present disclosure.

FIGS. 1-10 provide examples of probe systems 100 according to the present disclosure and/or of methods 1000 of operating and/or utilizing the probe systems. Elements that serve a similar, or at least substantially similar, purpose are labeled with like numbers in each of FIG. 10, and these elements may not be discussed herein with reference to each of FIGS. 1-10. Similarly, all elements may not be labeled in each of FIGS. 1-10, but reference numerals associated therewith may be utilized herein for consistency. Elements, components, and/or features that are discussed herein with reference to one or more of FIGS. 1-10 may be included in and/or utilized with any of FIGS. 1-10 without departing from the scope of the present disclosure.

In general, elements that are likely to be included in a given (i.e., a particular) embodiment are illustrated in solid lines, while elements that are optional to a given embodiment are illustrated in dashed lines. However, elements that are shown in solid lines are not essential to all embodiments, and an element shown in solid lines may be omitted from a given embodiment without departing from the scope of the present disclosure.

FIG. 1 is a schematic representation of examples of a probe system 100 according to the present disclosure. Probe system 100 includes a chuck 120 and a probe head assembly 150. Chuck 120 includes a support surface 125 that is configured to support a substrate 130. Chuck 120 additionally may include a chuck translation structure 110 that is configured to translatate least a portion of the chuck with respect to probe head assembly 150. Chuck translation structure 110 additionally or alternatively may be referred to as a substrate translation structure 110. Substrate 130 additionally or alternatively may be referred to as a wafer 130, as a semiconductor substrate 130, and/or as a semiconductor wafer 130. Substrate 130 includes at least one integrated circuit device 140, which also may be referred to herein as a device 140 and/or as a device under test (DUT) 140. As discussed, substrate 130 typically includes a plurality of DUTs 140. Each DUT 140 may include one or more contact pads 142.

Probe head assembly 150 includes at least one probe head 160 that may be configured to contact a corresponding DUT 140. More specifically, each probe head 160 may include at least one probe 162 that may be configured to contact at least one corresponding contact pad 142 on the corresponding DUT 140.

Probe head assembly 150 may include a probe head assembly translation structure 190 configured to translate at least a portion of the probe head assembly with respect to chuck 120, support surface 125, and/or a substrate 130 that is supported by support surface 125. Probe system 100 also includes a substrate thermal module 135 that is configured to regulate a temperature of substrate 130, as well as a controller 180 that is programmed to execute one or more methods described herein. For example, controller 180 may be programmed to generate a planar offset correction signal 182 and/or a height offset correction signal 184. Controller 180 also may be programmed to transmit planar offset correction signal 182 and/or height offset correction signal 184 to chuck translation structure 110 and/or to probe head assembly translation structure 190, such as via and/or utilizing any suitable communication linkage 186.

Controller 180 may include and/or be any suitable structure, device, and/or devices that may be adapted, configured, designed, constructed, and/or programmed to perform the functions discussed herein. As examples, controller 180 may include one or more of an electronic controller, a dedicated controller, a special-purpose controller, a personal computer, a special-purpose computer, a display device, a logic device, a memory device, and/or a memory device having computer-readable storage media.

The computer-readable storage media, when present, also may be referred to herein as non-transitory computer readable storage media. This non-transitory computer readable storage media may include, define, house, and/or store computer-executable instructions, programs, and/or code; and these computer-executable instructions may direct probe system 100 and/or controller 180 thereof to perform any suitable portion, or subset, of methods 1000. Examples of such non-transitory computer-readable storage media include CD-ROMs, disks, hard drives, flash memory, etc. As used herein, storage, or memory, devices and/or media having computer-executable instructions, as well as computer-implemented methods and other methods according to the present disclosure, are considered to be within the scope of subject matter deemed patentable in accordance with Section 101 of Title 35 of the United States Code.

Figure 2:
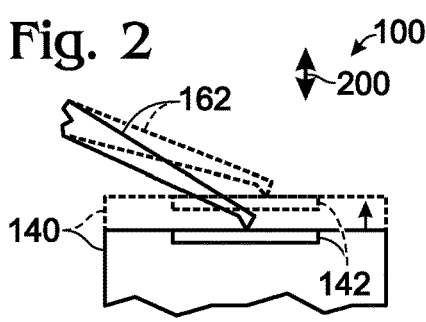
FIG. 2 is a schematic side view of a portion of a probe system according to the present disclosure.
Figure 3:
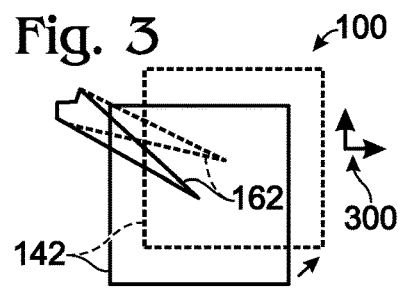
FIG. 3 is a schematic top view of a portion of a probe system according to the present disclosure.

Probe system 100 may be configured to perform wafer-level reliability testing on DUTs 140. Such wafer-level reliability testing may include a measurement, such as a bias temperature stress (BTS) measurement and/or a negative bias temperature instability (NBTI) measurement, in which it may be necessary to maintain electrical contact between a probe 162 and a corresponding contact pad 142 of a corresponding DUT 140 as a temperature of the DUT is modulated, or changed. As illustrated in FIGS. 2-3, this temperature modulation may result in a thermal displacement of DUT 140 and probe 162 relative to one another and/or along a contacting axis 200, which is at least substantially perpendicular to a surface 132 of the substrate (as illustrated in FIG. 2). Additionally or alternatively, this temperature modulation also may result in a thermal displacement of DUT 140 and probe 162 relative to one another and/or in a direction parallel to a surface plane 300, which is at least substantially parallel to surface 132 (as illustrated in FIG. 3).

As further illustrated in FIGS. 2-3, this thermal displacement of the DUT with respect to the probe may cause the probe to bend and/or deform as it maintains contact with contact pad 142, such as from a first conformation, as illustrated in solid lines, to a second conformation, as illustrated in dashed lines. Additionally or alternatively, the thermal displacement of the DUT with respect to the probe may cause the probe to scratch across the surface of the contact pad, potentially damaging the contact pad, damaging the probe, causing wear of the probe, disrupting the electrical contact between the probe and the DUT, and/or changing a contact resistance therebetween.

Figure 4:
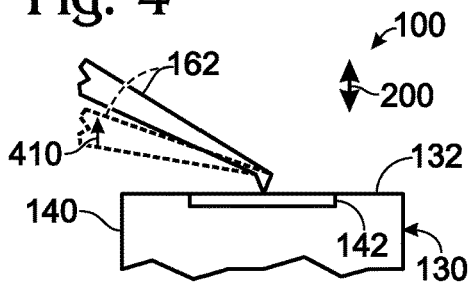
FIG. 4 is a schematic side view of a portion of a probe system according to the present disclosure.
Figure 5:
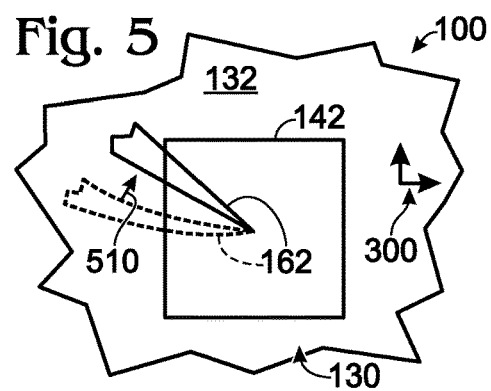
FIG. 5 is a schematic top view of a portion of a probe system according to the present disclosure.

However, and as illustrated in FIGS. 4-5, the systems and methods disclosed herein may be utilized to maintain the electrical contact between the probe and the DUT by adjusting a position of the probe with respect to the DUT as the temperature of the DUT is modulated. In particular, and with reference to FIGS. 4-5, the systems and methods disclosed herein may selectively generate, produce, and/or regulate a relative translation between probe 162 and DUT 140 along contacting axis 200, as indicated at 410 in FIG. 4, and/or a relative translation between probe 162 and DUT 140 in the direction that is parallel to surface plane 300, as indicated at 510 in FIG. 5. Such relative translation may be automatic and/or may be utilized to maintain the relative orientation between the probe and the contact pad and/or to decrease relative motion therebetween.

For example, the methods may include monitoring a position of at least a portion of substrate 130 and translating the substrate and/or probe head assembly 150 responsive, at least in part, to the monitoring. The methods additionally or alternatively may include monitoring a position of at least a portion of probe head assembly 150 and translating at least a portion of the probe head assembly and/or translating the substrate responsive, at least in part, to the monitoring. Stated another way, the maintaining contact may include monitoring a position of at least a portion of substrate 130 and/or of at least a portion of probe head assembly 150 and translating the substrate and/or at least a portion of the probe head assembly responsive, at least in part, to the monitoring.

While the present disclosure primarily describes systems and methods for maintaining alignment between probe 162 and DUT 140 while the probe is in contact with the DUT, this is not required. As an example, it is also within the scope of the present disclosure that the systems and methods disclosed herein may be utilized to maintain a relative orientation between probe 162 and DUT 140 when the probe and the DUT are not in contact with one another.

The systems and methods disclosed herein may permit and/or facilitate testing of DUT 140 with probe 162 in such a way that probe 162 and/or contact pad 142 experience significantly less wear than would be typical when the relative orientation is maintained via manual adjustment. Stated another way, the systems and methods disclosed herein permit maintaining the alignment between the probe and the DUT during thermal modulation of the DUT without manual user input and/or such that the alignment may be maintained to a stricter tolerance than would be typical of manual adjustment.

Figure 6:
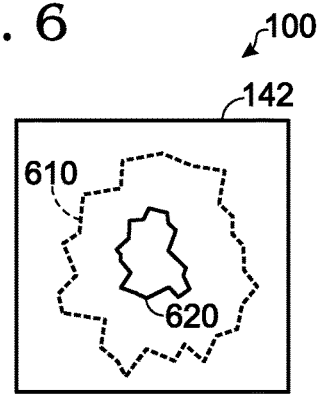
FIG. 6 is a schematic top view of a portion of a probe system according to the present disclosure.

As an example, FIG. 6 illustrates, in broken lines, a representative example of a manual contact pad wear pattern 610 and, in solid lines, a representative example of an automated contact pad wear pattern 620. Manual contact pad wear pattern 610 depicts an area of contact pad 142 that may be contacted by a probe during thermal modulation of DUT 140 when alignment between the probe and the contact pad is manually adjusted, such as by an operator a probe system. In contrast, automated contact pad wear pattern 620 depicts an area of the contact pad that may be contacted by the probe during an equivalent thermal modulation of DUT 140 when alignment between the probe and the contact pad is maintained using the systems and/or methods disclosed herein. As illustrated in FIG. 6, the automated systems and methods disclosed herein may permit maintaining alignment between the probe and the contact pad to a tighter tolerance and/or with a reduced contact area on the contact pad relative to manual and/or user-controlled alignment adjustment.

Figure 7:
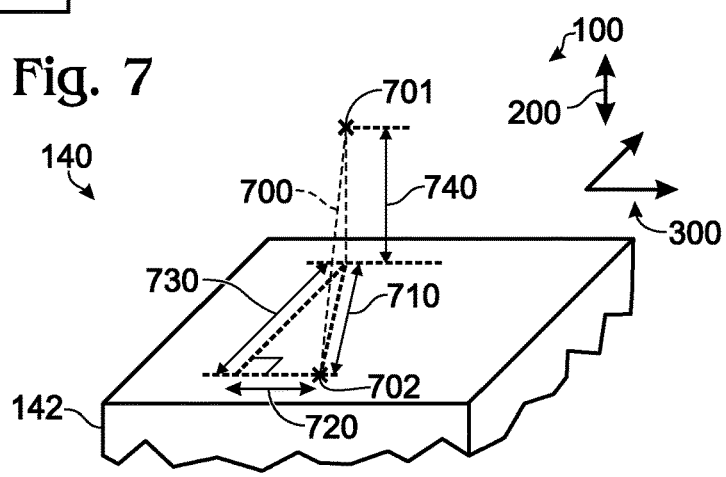
FIG. 7 is a schematic perspective view of a portion of a probe system according to the present disclosure.
Figure 8:
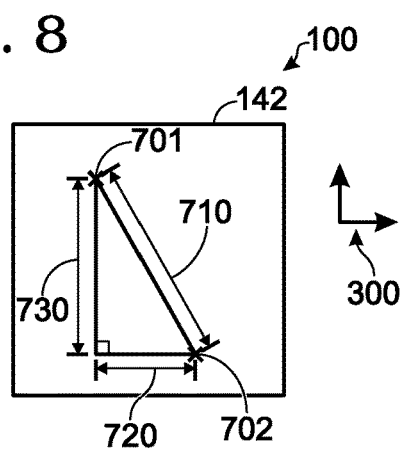
FIG. 8 is a schematic top view of a portion of a probe system according to the present disclosure.
Figure 9:
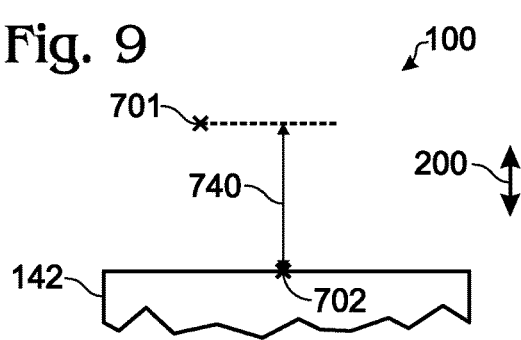
FIG. 9 is a schematic side view of a portion of a probe system according to the present disclosure.

With reference to FIG. 7, a thermal displacement of contact pad 142 of DUT 140 (as perhaps illustrated most clearly in FIGS. 1-2 and 4) with respect to probe 162 (as illustrated in FIGS. 1-5) may be characterized by an offset 700 between an initial reference point 701 and an offset reference point 702. Initial reference point 701 may refer to a location of at least a portion of DUT 140 relative to at least a portion of probe head assembly 150 prior to thermal displacement of the DUT relative to the probe head assembly. Offset reference point 702 may refer to the location of the portion of the DUT relative to the portion of the probe head assembly following the thermal displacement of the DUT relative to the probe head assembly. Offset 700 may refer to a displacement in three spatial dimensions, and therefore may be characterized by a planar offset component 710 that is parallel to surface plane 300 and a height offset component 740 that is parallel to contacting axis 200. The planar offset component further may be characterized by an x offset component 720 and a y offset component 730 that is at least substantially perpendicular to the x offset component, such that the x offset component and the y offset component are each at least substantially parallel to surface plane 300, FIG. 8 is a top-down view of a portion of probe head assembly 100, as depicted in FIG. 7, and further illustrates planar offset component 710, x offset component 720, and y offset component 730. Similarly, FIG. 9 is a side view of a portion of probe head assembly 100, as depicted in FIG. 7, and further illustrates height offset component 740.

Returning to FIG. 1, probe system 100 may include a planar offset adjustment structure 101 that may be configured to adjust a relative position of probe head assembly 150 and substrate 130 in a direction that is at least substantially parallel to surface plane 300. For instance, the planar offset adjustment structure may be configured to translate at least a portion of the probe head assembly in the direction that is at least substantially parallel to surface plane 300. Additionally or alternatively, the planar offset adjustment structure may be configured to translate at least a portion of the substrate in the direction that is at least substantially parallel to surface plane 300. The planar offset adjustment structure may form a portion of substrate translation structure 110 and/or of probe head assembly translation structure 190.

Probe system 100 additionally or alternatively may include a height offset adjustment structure 102 that may be configured to adjust a relative position of probe head assembly 150 and substrate 130 along contacting axis 200. For instance, the height offset adjustment structure may be configured to translate at least a portion of the probe head assembly along contacting axis 200. Additionally or alternatively, the height offset adjustment structure may be configured to translate at least a portion of the substrate along contacting axis 200. The planar offset adjustment structure may form a portion of substrate translation structure 110 and/or of probe head assembly translation structure 190.

With continued reference to FIG. 1, probe system 100 additionally or alternatively may include an optical assembly 170 that may be configured to perform an optical measurement, observation, and/or alignment of at least a portion of probe head assembly 150 and/or of at least a portion of substrate 130. As examples, optical assembly 170 may include a digital imaging device, a charge-coupled device, a camera, and/or an optical microscope. Additionally or alternatively, optical assembly 170 may include, or be, a laser interferometer module that is configured to measure a height offset associated with at least one of at least a portion of the probe head assembly and at least a portion of the substrate by measuring an electromagnetic interference pattern generated by a laser. Optical assembly 170 may be configured to provide an optical assembly signal 172 via a corresponding communication linkage 186 to controller 180.

Optical assembly 170 may be configured to operate in conjunction with an optically transparent region 155 that extends from a top side of probe head assembly 150 to a bottom side of the probe head assembly. Optically transparent region 155 may be configured to permit at least a portion of probe head 160, such as one or more probes 162, and/or at least a portion of substrate 130 to be viewable from a position located above probe head assembly 150. Stated differently, optically transparent region 155 may be configured to permit optical assembly 170 to perform an optical observation and/or measurement of a point located on probe head assembly 150 and/or of a point located on substrate 130 that otherwise would be obscured from the optical assembly by the probe head assembly.

FIG. 10 is a flowchart depicting methods 1000, according to the present disclosure, of maintaining alignment between a probe and a DUT during thermal modulation of the DUT. Methods 1000 may include bringing a substrate to an initial temperature at 1005, preliminarily aligning the probe and the DUT at 1010, and/or contacting the DUT with the probe at 1015. Methods 1000 include beginning a thermal modulation at 1020, and automatically maintaining alignment between the probe and the DUT during the thermal modulation at 1030. The maintaining the alignment at 1030 includes maintaining a planar alignment at 1040 and maintaining a height alignment at 1060, and the maintaining the planar alignment at 1040 and the maintaining the height alignment at 1060 may be performed in any suitable order and/or sequence within methods 1000. As an example, the maintaining at 1040 and the maintaining at 1060 may be performed concurrently, or at least substantially concurrently. As another example, the maintaining at 1040 may be performed prior to the maintaining at 1060. As yet another example, the maintaining at 1060 may be performed prior to the maintaining at 1040.

The maintaining the planar alignment at 1040 includes collecting an initial, or a first, image of a planar offset fiducial at 1042, collecting a subsequent, or a second, image of the planar offset fiducial at 1044, comparing the initial image and the subsequent image at 1046, adjusting a planar location at 1048, and repeating at least a portion of the maintaining the planar alignment at 1050. The maintaining the height alignment at 1060 includes determining an initial, or a first, height reference of a height offset fiducial at 1062, determining a subsequent, or a second, height reference of the height offset fiducial at 1064, comparing the initial height reference and the subsequent height reference at 1066, adjusting a height location at 1068, and repeating at least a portion of the maintaining the height alignment at 1070. Methods 1000 further may include ending the thermal modulation at 1080 and/or disengaging the probe from the DUT at 1090.

Bringing the substrate to the initial temperature at 1005 may include changing the temperature of a substrate, such as substrate 130 of FIG. 1, to a predetermined initial temperature via a substrate thermal module, such as substrate thermal module 135 of FIG. 1. The bringing at 1005 additionally or alternatively may include soaking the substrate at the initial temperature for a predetermined soak time, such as to permit thermal equilibrium of the substrate and any elements in thermal contact with the substrate at the initial temperature. As used herein, soaking the substrate at the initial temperature additionally or alternatively may be referred to as equilibrating the substrate at the initial temperature and/or acclimating the substrate to the initial temperature.

Preliminarily aligning the probe and the DUT at 1010 may include translating the probe and/or the DUT (such as with probe head assembly translation structure 190 and/or chuck translation structure 110 of FIG. 1) to substantially align a probe (such as probe 162 of FIGS. 1-5) with a corresponding contact pad (such as contact pad 142 of FIGS. 1-9) of a DUT (such as DUT 140 of FIGS. 1-2 and 4). For example, the preliminarily aligning at 1010 may include aligning the probe with the contact pad such that a planar offset component (such as planar offset component 710 of FIG. 7) between the probe and the contact pad is no greater than a predetermined threshold planar offset component. The probe may be a needle probe and/or may form at least a portion of a probe card.

Contacting the DUT with the probe at 1015 may be performed subsequent to the preliminarily aligning the probe and the DUT at 1010 and prior to the beginning the thermal modulation at 1020. For example, the contacting at 1015 may include translating the probe and/or the substrate along a contacting axis, such as contacting axis 200 of FIGS. 2, 4, 7, and 9, to bring the probe and the DUT into electrical and/or physical contact with one another. As another example, the contacting at 1015 may include contacting the probe with a contact pad, such as contact pad 142 of FIGS. 1-9, of the DUT.

Beginning the thermal modulation at 1020 includes beginning to change a temperature of the DUT from a first DUT temperature to a second DUT temperature. The first DUT temperature may be greater than the second DUT temperature and/or the first DUT temperature may be less than the second DUT temperature. For example, the first DUT temperature may be less than −100° C., less than −75° C., less than −50° C., less than −25° C., less than 0° C., less than 10° C., less than 20° C., less than 30° C., less than 40° C., less than 50° C., less than 60° C., more than 300° C., more than 250° C., more than 20° C., more than 150° C., more than 100° C., more than 75° C., and/or more than 50° C. Similarly, the second DUT temperature may be less than −100° C., less than −75° C., less than −50° C., less than −25° C., less than 0° C., less than 10° C., less than 20° C., less than 30° C., less than 40° C., less than 50° C., less than 60° C., more than 300° C., more than 250° C., more than 200° C., more than 150° C., more than 100° C., more than 75° C., and/or more than 50° C. Additionally or alternatively, the greater of the first DUT temperature and the second DUT temperature may exceed the lesser of the first DUT temperature and the second DUT temperature by at least 5° C., at least 10° C., at least 25° C., at least 50° C., at least 75° C., at least 100° C., at least 150° C., at least 200° C., at least 300° C., and/or at least 500° C.

As discussed, the maintaining the planar alignment at 1040 includes collecting the initial image (at 1042) and the subsequent image (at 1044) of the planar offset fiducial. The planar offset fiducial may include a probe head assembly planar offset fiducial defined by the probe head assembly. For example, the probe head assembly planar offset fiducial may include at least a portion of the probe head assembly, at least a portion of a probe card of the probe head assembly, at least a portion of a probe head of the probe head assembly, at least a portion of a probe tip of the probe head, at least a portion of the probe, and/or at least a portion of a probe head assembly reference structure. Additionally or alternatively, the planar offset fiducial may include a substrate planar offset fiducial defined by the substrate. For example, the substrate planar offset fiducial may include at least a portion of the substrate, at least a portion of the DUT, at least a portion of a contact pad of the DUT, and/or at least a portion of a substrate reference structure.

The collecting the initial image at 1042 and the collecting the subsequent image at 1044 may include collecting images that provide spatial information relating to motion of the planar offset fiducial in a surface plane, such as surface plane 300 of FIGS. 3, 5, and 7-8. The collecting the initial image at 1042 and the collecting the subsequent image at 1044 may be performed with an optical assembly, such as optical assembly 170 of FIG. 1. The collecting the initial image at 1042 and the collecting the subsequent image at 1044 may include collecting visible light and/or collecting electromagnetic radiation with the optical assembly.

The collecting the initial image at 1042 and the collecting the subsequent image at 1044 may be performed with any suitable timing and/or sequence within methods 1000. As examples, the collecting at 1042 may be performed subsequent to the bringing at 1005, subsequent to the preliminarily aligning at 1010, subsequent to the contacting at 1015, and/or prior to the beginning the thermal modulation at 1020. As additional and/or alternative examples, the collecting at 1044 may be performed subsequent to the bringing at 1005, subsequent to the preliminarily aligning at 1010, subsequent to the contacting at 1015, subsequent to the collecting at 1042, and/or subsequent to initiation of, or at least partially concurrent with, the beginning the thermal modulation at 1020.

Stated another way, the collecting at 1042 may be performed prior to changing, or purposefully changing, the temperature of the DUT, such as may be accomplished during and/or subsequent to the beginning the thermal modulation at 1020. In contrast, the collecting at 1044 may be performed, or repeatedly performed, while the temperature of the DUT is being changed, such as subsequent to and/or concurrently with the beginning the thermal modulation at 1020. However, this is not required, and the initial image may be collected (via the collecting at 1042) at any suitable time.

The comparing the initial image and the subsequent image at 1046 may result in determining a planar offset, s as planar offset 710 of FIGS. 7-8, may be a difference between a location of the planar offset fiducial in the initial image, as measured in the surface plane, or in a direction that is parallel to the surface plane, and a location of the planar offset fiducial in the subsequent mirage, as measured in the surface plane, or in the direction that is parallel to the surface plane. For example, the comparing at 1046 may determine the planar offset using a pattern recognition routine. As another example, the comparing at 1046 may include determining a planar displacement distance between the location of the planar offset fiducial in the initial image, as measured in the surface plane, and a location of the planar offset fiducial in the subsequent image, as measured in the surface plane, and/or may include determining an x component of the planar displacement distance and/or a y component of the planar displacement distance. The y component of the planar displacement distance may be perpendicular, or at least substantially perpendicular, to the x component of the planar displacement distance.

As discussed, the maintaining the height alignment at 1060 includes determining the initial height reference (at 1062) and the subsequent height reference (at 1064) of the height offset fiducial. The height offset fiducial may include a probe head assembly height offset fiducial that is defined by the probe head assembly. For example, the probe head assembly height offset fiducial may include at least a portion of the probe head assembly, at least a portion of the probe card of the probe head assembly, at least a portion of the probe head of the probe head assembly, at least a portion of the probe tip of the probe head, at least a portion of the probe, and/or at least a portion of the probe head assembly reference structure. Additionally or alternatively, the height offset fiducial may include a substrate height offset fiducial defined by the substrate. For example, the substrate height offset fiducial may include at least a portion of the substrate, at least a portion of the DUT, at least a portion of a contact pad of the DUT, and/or at least a portion of a substrate reference structure. The probe head assembly height offset fiducial may be, or be the same as, the probe head assembly planar offset fiducial. The substrate height offset fiducial may be, or be the same as, the substrate planar offset fiducial.

The comparing the initial height reference and the subsequent height reference at 1066 may result in determining a height offset, such as height offset 740 of FIGS. 7 and 9, which may be a distance between the initial height reference and the subsequent height reference as measured along the contacting axis. For example, the height offset may be determined by comparing the initial height reference and the subsequent height reference using a pattern recognition routine.

The determining the initial height reference at 1062 and the determining the subsequent height reference at 1064 may be performed with the optical assembly. For example, the optical assembly may include an optical microscope, and the determining the initial height reference may include initially substantially focusing the optical microscope on the height offset fiducial and the determining the subsequent height reference may include subsequently substantially focusing the optical microscope on the height offset fiducial, such that the determining the height offset may be based, at least in part, on an adjustment difference of the optical microscope between the initially substantially focusing and the subsequently substantially focusing. The adjustment difference may correspond to a translation distance of at least a portion of the optical microscope and may be substantially equal to a translation distance of an objective of the microscope. Additionally or alternatively, the optical assembly may include a laser, and the determining the height offset may be based, at least in part, on a measurement of an electromagnetic interference pattern generated by the laser. For example, the optical assembly may include, or be, a laser interferometer module.

The determining the initial height reference at 1062 and the determining the subsequent height reference at 1064 may be performed with any suitable timing and/or sequence within methods 1000. As examples, the determining at 1062 may be performed subsequent to the bringing at 1005, subsequent to the preliminarily aligning at 1010, subsequent to the contacting at 1015, and/or prior to the beginning the thermal modulation at 1020. As additional and/or alternative examples, the determining at 1064 may be performed subsequent to the bringing at 1005, subsequent to the preliminarily aligning at 1010, subsequent to the contacting at 1015, subsequent to the collecting at 1042, and/or subsequent to initiation of, or at least partially concurrent with, the beginning the thermal modulation at 1020.

Stated another way, the determining at 1062 may be performed prior to changing, or purposefully changing, the temperature of the DUT, such as may be accomplished during and/or subsequent to the beginning the thermal modulation at 1020. In contrast, the determining at 1064 may be performed, or repeatedly performed, while the temperature of the DUT is being changed, such as subsequent to and/or concurrently with the beginning the thermal modulation at 1020. However, this is not required, and the initial height reference may be determined (via the determining at 1062) at any suitable time.

Methods 1000 may include one or more methods that are performed by an automated controller, such as controller 180 of FIG. 1. For example, the adjusting the planar location at 1048 may include generating a planar offset correction signal, such as planar offset correction signal 182 of FIG. 1, which may be generated by the automated controller, and may be based, at least in part, on the planar offset calculated at 1046. The planar offset correction signal may include an instruction to translate the planar offset fiducial by a planar translation component, which has a magnitude that is substantially equal to a magnitude of the planar offset and a direction that is substantially opposed to a direction of the planar offset. Accordingly, the adjusting the planar location at 1048 may include planarly translating the probe and/or the DUT by the planar translation component and in the surface plane. The planar translation component may have an x translation component and a y translation component, which is at least substantially perpendicular to the x translation component, and the adjusting the planar location at 1048 may include translating by the x translation component and translating by the y translation component simultaneously, and/or may include the translating by the x translation component and the translating by the y translation component sequentially. As used herein, the adjusting the planar location at 1048 additionally or alternatively may be referred to as planarly translating at 1048.

Subsequent to the generating the planar offset correction signal, the adjusting the planar location at 1048 may include providing the planar offset correction signal to a planar offset adjustment structure, such as planar offset adjustment structure 101 of FIG. 1. As an example, the adjusting the location of the planar offset fiducial may include adjusting with the planar offset adjustment structure and may be based, at least in part, on the planar offset correction signal. The planar offset adjustment structure may include a probe head assembly translation structure, which is configured to translate the probe head assembly relative to the substrate, and/or a substrate translation structure, which is configured to translate the substrate relative to the probe head assembly.

Similarly, the adjusting the height location at 1068 may include generating a height offset correction signal, such as height offset correction signal 184 of FIG. 1, which may be generated by the automated controller. The height offset correction signal may be based, at least in part, on the height offset calculated at 1066. The height offset correction signal may include an instruction to translate the height offset fiducial by a height translation component. The height translation component may have a magnitude that is substantially equal to a magnitude of the height offset and a direction that is substantially opposed to a direction of the height offset. The adjusting the location of the height offset fiducial may include translating, or normally translating, the probe head and/or the DUT by the height translation component and along the contacting axis.

As used herein, normally translating refers to translating along the contacting axis that is at least substantially normal to the surface plane, and the adjusting the height location at 1068 additionally or alternatively may be referred to as normally translating at 1068. The normally translating at 1068 may include providing the height offset correction signal to a height offset adjustment structure, such as height offset adjustment structure 102 of FIG. 1. The adjusting the location of the height offset fiducial may include adjusting with the height offset adjustment structure and may be based, at least in part, on the height offset correction signal. The height offset adjustment structure may include the probe head assembly translation and/or the substrate translation structure. The planarly translating at 1048 and the normally translating at 1068 may be performed simultaneously, and/or may be performed sequentially.

The repeating at 1050 may include repeating any suitable portion of methods 1000, such as any suitable step, or sub-step, of the maintaining at 1040. As examples, the repeating at 1050 may include repeating one or more of the collecting at 1042, the collecting at 1044, the comparing at 1046, and/or the adjusting at 1048. As a more specific example, the repeating at 1050 may include sequentially repeating the collecting at 1044, the comparing at 1046, and the adjusting at 1048 a plurality of times. Under these conditions, each repetition of the collecting at 1044 may include collecting a respective subsequent image, each repetition of the comparing at 1046 may include comparing the respective subsequent image to the initial image and/or to a prior image, such as to determine a respective planar offset, and each repetition of the adjusting at 1048 may include performing a respective adjustment of the planar location that is based, at least in part, on the respective planar offset.

Similarly, the repeating at 1070 may include repeating any suitable portion of methods 1000, such as any suitable step, or sub-step, of the maintaining at 1060. As examples, the repeating at 1070 may include repeating one or more of the determining at 1062, the determining at 1064, the comparing at 1066, and/or the adjusting at 1068. As a more specific example, the repeating at 1070 may include sequentially repeating the determining at 1064, the comparing at 1066, and the adjusting at 1068 a plurality of times. Under these conditions, each repetition of the deter Mg at 1064 may include determining a respective subsequent height reference, each repetition of the comparing at 1066 may include comparing the respective subsequent height reference to the initial height reference and/or to a prior height reference to determine a respective height offset, and each repetition of the adjusting at 1068 may include performing a respective adjustment of the height location that is based, at least in part, on the respective height offset.

The maintaining the alignment between the probe and the DUT at 1030 may include maintaining the alignment in the contacting direction, maintaining the alignment in the surface plane, maintaining the alignment in a direction that is parallel to the surface plane, and/or maintaining an electrical contact between the probe and the contact pad of the DUT. For example, the maintaining the alignment may include maintaining a contact resistance between the probe and the contact pad to within a threshold fraction of an initial contact resistance between the probe and the contact pad. The threshold fraction of the initial contact resistance may be less than 1% of the initial contact resistance, less than 5% of the initial contact resistance, less than 10% of the initial contact resistance, less than 15% of the initial contact resistance, less than 20% of the initial contact resistance, less than 25% of the initial contact resistance, less than 50% of the initial contact resistance, less than 75% of the initial contact resistance, less than 100% of the initial contact resistance, less than 150% of the initial contact resistance, less than 200% of the initial contact resistance, less than 250% of the initial contact resistance, less than 300% of the initial contact resistance, less than 350% of the initial contact resistance, less than 400% of the initial contact resistance, less than 450% of the initial contact resistance, and/or less than 500% of the initial contact resistance.

Additionally or alternatively, the maintaining the alignment between the probe and the DUT at 1030 may include maintaining less than a threshold contact resistance between the probe and the contact pad of the DUT. Examples of the threshold contact resistance include threshold contact resistances of 1 milliohm, 2 milliohms, 3 milliohms, 4 milliohms, 5 milliohms, 6 milliohms, 7 milliohms, 8 milliohms, 9 milliohms, 10 milliohms, 25 milliohms, 50 milliohms, 100 milliohms, 250 milliohms, 500 milliohms, and/or 1000 milliohms.

Additionally or alternatively, the maintaining the alignment between the probe and the DUT may include maintaining a planar alignment between a probe planar alignment reference point and a DUT planar alignment reference point to within a threshold planar alignment variation. The probe planar alignment reference point may include and/or be the planar offset fiducial, and/or may be at least a portion of the probe, such as an end of the probe that is proximal to the DUT. The DUT planar alignment reference point may include and/or be at least a portion of the contact pad of the DUT, such as a center point of the contact pad. The threshold planar alignment variation may be less than 0.5 μm (micrometers), less than 1 μm, less than 1.5 μm, less than 2 μm, less than 5 μm, and/or less than 10 μm. Additionally or alternatively, the threshold planar alignment variation may be less than 1% of a maximum linear dimension of the contact pad, less than 2% of the maximum linear dimension of the contact pad, less than 5% of the maximum linear dimension of the contact pad, less than 10% of the maximum linear dimension of the contact pad, less than 20% of the maximum linear dimension of the contact pad, and/or less than 50% of the maximum linear dimension of the contact pad.

Additionally or alternatively, the maintaining the alignment between the probe and the DUT may include maintaining a height alignment between a probe height alignment reference point and a DUT height alignment reference point, as measured along the contacting axis, to less than a threshold height variation. The probe height alignment reference point may be the height offset fiducial, and/or may be at least a portion of the probe, such as an end of the probe that is proximal to the DUT. The DUT height alignment reference point may be at least a portion of the contact pad of the DUT, such as a top surface of the contact pad. The threshold height variation may be less than 0.5 µm, less than 1 µm, less than 1.5 µm, less than 2 µm, less than 5 µm, and/or less than 10 µm. Additionally or alternatively, the threshold height variation may be less than 1% of the maximum linear dimension of a/the contact pad, less than 2% of the maximum linear dimension of the contact pad, less than 5% of the maximum linear dimension of the contact pad, less than 10% of the maximum linear dimension of the contact pad, less than 20% of the maximum linear demension of the contact pad, and/or less than 50% of the maximum linear dimension of the contact pad.

Methods 1000 may include automated error correction techniques in the form of over sampling steps. For example, the determining the planar offset may include determining a plurality of provisional planar offsets of a corresponding plurality of planar offset fiducials prior to the adjusting the planar location. The plurality of provisional planar offsets may include one or more outlier provisional planar offsets. For example, an outlier provisional planar offset may refer to a provisional planar offset of the plurality of provisional planar offsets whose value differs from an average value of the plurality of provisional planar offsets by a difference that is greater than a threshold difference variation. The threshold difference variation may be a fixed and/or predetermined quantity, or may be determined by a statistical measure of the plurality of provisional planar offsets, such as a standard deviation of the plurality of provisional planar offsets. When the plurality of provisional planar offsets includes an outlier provisional planar offset, the adjusting the planar location at 1048 may be based, at least on part, on a subset of the plurality of provisional planar offsets that excludes the outlier provisional planar offset. Additionally or alternatively, when the plurality of provisional planar offsets includes the outlier provisional planar offset, methods 1000 may include repeating the maintaining the planar alignment without performing the adjusting the planar location.

Similarly, the determining the height offset may include determining a plurality of provisional height offsets of the height offset fiducial prior to the adjusting the height location. The determining the plurality of provisional height offsets may include repeatedly and sequentially determining the height offset of the height offset fiducial. When the plurality of provisional height offsets includes an outlier provisional height offset, the adjusting the height location may be based, at least in part, on a subset of the plurality of provisional height offsets that excludes the outlier provisional height offset. Additionally or alternatively, when the plurality of provisional height offsets includes the outlier provisional height offset, methods 1000 may include repeating the maintaining the height alignment without performing the adjusting the height location.

Methods 1000 have been disclosed in the context of maintaining the alignment between a single probe and a single contact pad on a single DUT. However, it is within the scope of the present disclosure that the methods 1000 may be employed to simultaneously maintain alignment between a plurality of probes and a corresponding plurality of contact pads on a corresponding plurality of DUTs.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B", when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A method of maintaining alignment between a probe, which forms a portion of a probe head assembly, and a device under test (DUT), which is present on a surface of a substrate, during thermal modulation of the DUT, the method comprising:

collecting an initial image of a planar offset fiducial;

determining an initial height reference of a height offset fiducial;

changing a temperature of the DUT from a first DUT temperature to a second DUT temperature;

subsequent to the collecting and during the changing, maintaining a planar alignment between the probe and the DUT by automatically and repeatedly:

(i) collecting a subsequent image of the planar offset fiducial;

(ii) comparing the initial image and the subsequent image to determine a planar offset of the planar offset fiducial, wherein the planar offset is defined within a surface plane that is at least substantially parallel to the surface of the substrate; and (iii) adjusting a planar location of at least one of the probe and the DUT to maintain the planar alignment, wherein the adjusting is based, at least in part, on the planar offset; and subsequent to the determining and during the changing, maintaining a height alignment between the probe and the DUT by automatically and repeatedly:

(i) determining a subsequent height reference of the height offset fiducial;

(ii) comparing the initial height reference and the subsequent height reference to determine a height offset of the height offset fiducial, wherein the height offset is defined along a contacting axis that is at least substantially perpendicular to the surface of the substrate; and (iii) adjusting a height location of at least one of the probe and the DUT to maintain the height alignment, wherein the adjusting is based, at least in part, on the height offset.

A2. The method of paragraph A1, wherein the method further includes generating a planar offset correction signal based, at least in part, on the planar offset.

A3. The method of paragraph A2, wherein the planar offset correction signal includes an instruction to translate the planar offset fiducial by a planar translation component, wherein the planar translation component has a magnitude that is substantially equal to a magnitude of the planar offset and a direction that is substantially opposed to a direction of the planar offset.

A4. The method of paragraph A3, wherein the adjusting the location of the planar offset fiducial includes planarly translating at least one of the probe and the DUT by the planar translation component and in a direction that is parallel to the surface plane.

A5. The method of any of paragraphs A3-A4, wherein the planar translation component has an x translation component y translation component that is at least substantially perpendicular to the x translation component.

A6. The method of paragraph A5, wherein the planarly translating includes translating by the x translation component and by the y translation component simultaneously.

A7. The method of any of paragraphs A5-A6, wherein the planarly translating includes translating by the x translation component and by the y translation component sequentially.

A8. The method of any of paragraphs A1-A7, wherein the generating the planar offset correction signal is performed by an automated controller.

A9. The method of any of paragraphs A1-A8, wherein the method further includes providing the planar offset correction signal to a planar offset adjustment structure, and wherein the adjusting the location of the planar offset fiducial includes adjusting with the planar offset adjustment structure based, at least in part, on the planar offset correction signal.

A10. The method of paragraph A9, wherein the planar offset adjustment structure includes at least one of a probe head assembly translation structure configured to translate the probe head assembly relative to the substrate and a substrate translation structure configured to translate the substrate relative to the probe head assembly.

A11. The method of any of paragraphs A1-A10, wherein the method further includes generating a height offset correction signal based, at least in part, on the height offset.

A12. The method of paragraph A11, wherein the height offset correction signal includes an instruction to translate the height offset fiducial by a height translation component, wherein the height translation component has a magnitude that is substantially equal to a magnitude of the height offset and a direction that is substantially opposed to a direction of the height offset.

A13. The method of paragraph A12, wherein the adjusting the location of the height offset fiducial includes normally translating at least one of the probe head and the DUT by the height translation component and along the contacting axis.

A14. The method of paragraph A13, wherein the planarly translating and the normally translating are performed simultaneously.

A15. The method of any of paragraphs A13-A14, wherein the planarly translating and the normally translating are performed sequentially.

A16. The method of any of paragraphs A11-A15, wherein the generating the height offset correction signal is performed by an/the automated controller.

A17. The method of any of paragraphs A11-A16, wherein the method further includes providing the height offset correction signal to a height offset adjustment structure, and wherein the adjusting the location of the height offset fiducial includes adjusting with the height offset adjustment structure based, at least in part, on the height offset correction signal.

A18. The method of paragraph A17, wherein the height offset adjustment structure includes at least one of a/the probe head assembly translation structure configured to translate the probe head assembly relative to the substrate and a/the substrate translation st re configured to translate the substrate relative to the probe head assembly.

A19. The method of any of paragraphs A1-A18, wherein the planar offset fiducial includes a probe head assembly planar offset fiducial defined by the probe head assembly.

A20. The method of paragraph A19, wherein the probe head assembly planar offset fiducial includes at least one of:
(i) at least a portion of the probe head assembly;
(ii) at least a portion of a probe card of the probe head assembly;
(iii) at least a portion of a probe head of the probe head assembly;
(iv) at least a portion of a probe tip of a/the probe head;
(v) at least a portion of the probe; and
(vi) at least a portion of a probe head assembly reference structure.

A21. The method of any of paragraphs A1-A20, wherein the planar offset fiducial includes a substrate planar offset fiducial defined by the substrate.

A22. The method of paragraph A21, wherein the substrate planar offset fiducial includes at least one of:
(i) at least a portion of the substrate;
(ii) at least a portion of the DUT;
(iii) at least a portion of a contact pad of the DUT; and
(iv) at least a portion of a substrate reference structure.

A23. The method of any of paragraphs A1-A22, wherein the comparing the initial image and the subsequent image includes comparing a difference between a location of the planar offset fiducial in the initial image and a location of the planar offset fiducial in the subsequent image as measured in a direction that is parallel to the surface plane.

A24. The method of any of paragraphs A1-A23, wherein the collecting the initial image and the collecting the subsequent image include collecting with an optical assembly.

A25. The method of paragraph A24, wherein the optical assembly includes at least one of:
(i) a digital imaging device;
(ii) a charge-coupled device;
(iii) a camera; and
(iv) an optical microscope.

A26. The method of any of paragraphs A1-A25, wherein the collecting the initial image and the collecting the subsequent image include collecting at least one of visible light and electromagnetic radiation.

A27. The method of any of paragraphs A1-A26, wherein the collecting the initial image and the collecting the subsequent image include collecting images that provide spatial information relating to motion of the planar offset fiducial in a direction that is parallel to the surface plane.

A28. The method of any of paragraphs A1-A27, wherein the height offset fiducial includes a probe head assembly height offset fiducial that is defined by the probe head assembly.

A29. The method of paragraph A28, wherein the probe head assembly height offset fiducial includes at least one of:
(i) at least a portion of the probe head assembly;
(ii) at least a portion of a/the probe card of the probe head assembly;
(iii) at least a portion of a/the probe head of the probe head assembly;
(iv) at least a portion of a/the probe tip of a/the probe head;
(v) at least a portion of the probe; and
(vi) at least a portion of a/the probe head assembly reference structure.

A30. The method of any of paragraphs A28-A29, wherein the probe head assembly height offset fiducial is the probe head assembly planar offset fiducial.

A31. The method of any of paragraphs A1-A30, wherein the height offset fiducial includes a substrate height offset fiducial that is defined by the substrate.

A32. The method of paragraph A31, wherein the substrate height offset fiducial includes at least one of:
(i) at least a portion of the substrate;
(ii) at least a portion of the DUT;
(iii) at least a portion of a/the contact pad of the DUT; and
(iv) at least a portion of a/the substrate reference structure.

A33. The method of any of paragraphs A31-A32, when dependent upon paragraph A21, wherein the substrate height offset fiducial is the substrate planar offset fiducial.

A34. The method of any of paragraphs A1-A33, wherein the height offset is a distance between the initial height reference and the subsequent height reference as measured along the contacting axis.

A35. The method of any of paragraphs A1-A34, wherein the determining the initial height reference and the determining the subsequent height reference are performed with an/the optical assembly.

A36. The method of paragraph A35, wherein the optical assembly includes an optical microscope, and further wherein the determining the initial height reference includes initially substantially focusing the optical microscope on the height offset fiducial, wherein the determining the subsequent height reference includes subsequently substantially focusing the optical microscope on the height offset fiducial, and wherein the determining the height offset is based, at least in part, on an adjustment difference of the optical microscope between the initially substantially focusing and the subsequently substantially focusing.

A37. The method of paragraph A36, wherein the adjustment difference corresponds to a translation distance of at least a portion of the optical microscope.

A38. The method of any of paragraphs A36-A37, wherein the adjustment difference is substantially equal to a translation distance of an objective of the optical microscope.

A39. The method of any of paragraphs A35-A38, wherein the optical assembly includes a laser, and further wherein the determining the height offset is based, at least in part, on a measurement of an electromagnetic interference pattern generated by the laser.

A40. The method of any of paragraphs A1-A39, wherein the first DUT temperature is greater than the second DUT temperature.

A41. The method of any of paragraphs A1-A39, wherein the first DUT temperature is less than the second DUT temperature.

A42. The method of any of paragraphs A1-A41, wherein the first DUT temperature is less than −100° C., less than −75° C., less than −50° C., less than −25° C., less than 0° C., less than 10° C., less than 20° C., less than 30° C., less than 40° C., less than 50° C., less than 60° C., more than 300° C., more than 250° C., more than 200° C., more than 150° C., more than 100° C., more than 75° C., and/or more than 50° C.

A43. The method of any of paragraphs A1-A42, wherein the second DUT temperature is less than −100° C., less than −75° C., less than −50° C., less than −25° C., less than 0° C., less than 10° C., less than 20° C., less than 30° C., less than 40° C., less than 50° C., less than 60° C., more than 300° C., more than 250° C., more than 200° C., more than 150° C., more than 100° C., more than 75° C., and/or more than 50° C.

A44. The method of any of paragraphs A1-A43, wherein the greater of the first DUT temperature and the second DUT temperature exceeds the lesser of the first DUT temperature and the second DUT temperature by at least 5° C., at least 10° C., at least 25° C., at least 50° C., at least 75° C., at least 100° C., at least 150° C., at least 200° C., at least 300° C., and/or at least 500° C.

A45. The method of any of paragraphs A1-A44, wherein the method further includes contacting the DUT with the probe.

A46. The method of paragraph A45, wherein the contacting is performed prior to the changing the temperature.

A47. The method of any of paragraphs A45-A46, wherein the maintaining the planar alignment and the maintaining the height alignment include maintaining contact between the probe and the DUT during the changing the temperature of the DUT.

A48. The method of paragraph A47, wherein the maintaining the planar alignment and the maintaining the height alignment include maintaining an electrical contact between the probe and a/the contact pad of the DUT.

A49. The method of any of paragraphs A47-A48, wherein the maintaining the planar alignment and the maintaining the height alignment include maintaining a contact resistance between the probe and a/the contact pad of the DUT to within a threshold fraction of an initial contact resistance between the probe and the contact pad.

A50. The method of paragraph A49, wherein the threshold fraction of the initial contact resistance is less than 1% of the initial contact resistance, less than 5% of the initial contact resistance, less than 10% of the initial contact resistance, less than 15% of the initial contact resistance, less than 20% of the initial contact resistance, less than 25% of the initial contact resistance, less than 50% of the initial contact resistance, less than 75% of the initial contact resistance, less than 100% of the initial contact resistance, less than 150% of the initial contact resistance, less than 200% of the initial contact resistance, less than 250% of the initial contact resistance, less than 300% of the initial contact resistance, less than 350% of the initial contact resistance, less than 400% of the initial contact resistance, less than 450% of the initial contact resistance, and/or less than 500% of the initial contact resistance.

A51. The method of any of paragraphs A47-A50, wherein the maintaining the planar alignment and the maintaining the height alignment includes maintaining a/the contact resistance between the probe and a/the contact pad of the DUT to less than a threshold contact resistance.

A52. The method of paragraph A51, wherein the threshold contact resistance is 1 milliohm, 2 milliohm, 3 milliohm, 4 milliohm, 5 milliohm, 6 milliohm, 7 milliohm, 8 milliohm, 9 milliohm, and/or 10 milliohm.

A53. The method of any of paragraphs A47-A52, wherein the maintaining the contact includes monitoring a position of at least a portion of the substrate and translating the substrate.

A54. The method of any of paragraphs A47-A53, wherein the maintaining the contact includes monitoring a position of at least a portion of the probe head assembly and translating at least the portion of the probe head assembly.

A55. The method of any of paragraphs A47-A54, wherein the maintaining the contact includes monitoring a position of at least a portion of the substrate and of at least a portion of the probe head assembly, and further includes translating at least one of:
  (i) the substrate, and
  (ii) at least a portion of the probe head assembly.

A56. The method of any of paragraphs A1-A55, wherein the maintaining the planar alignment between the probe and the DUT includes maintaining the planar alignment between a probe planar alignment reference point and a DUT planar alignment reference point to within a threshold planar alignment variation.

A57. The method of paragraph A56, wherein the probe planar alignment reference point is at least a portion of the probe.

A58. The method of paragraph A57, wherein the probe planar alignment reference point is an end of the probe that is proximal the DUT.

A59. The method of any of paragraphs A56-A57, wherein the planar alignment reference point is at least a portion of a/the contact pad of the DUT.

A60. The method of paragraph A59, wherein the DUT planar alignment reference point is a center point of the contact pad.

A61. The method of any of paragraphs A56-A60, wherein the threshold planar alignment variation is less than 0.5 μm (micrometers), less than 1 μm, less than 1.5 μm, less than 2 μm, less than 5 μm, and/or less than 10 μm.

A62. The method of any of paragraphs A56-A61, wherein the threshold planar alignment variation is less than 1% of a maximum linear dimension of a/the contact pad, less than 2% of the maximum linear dimension of the contact pad, less than 5% of the maximum linear dimension of the contact pad, less than 10% of the maximum linear dimension of the contact pad, less than 20% of the maximum linear dimension of the contact pad, and/or less than 50% of the maximum linear dimension of the contact pad.

A63. The method of any of paragraphs A1-A62, wherein the maintaining the height alignment between the probe and the DUT includes maintaining the height alignment between a probe height alignment reference point and a DUT height alignment reference point, as measured along the contacting axis, to less than a threshold height variation.

A64. The method of paragraph A63, wherein the probe height alignment reference point is at least a portion of the probe.

A65. The method of paragraph A64, wherein the probe height alignment reference point is an end of the probe that is proximal the DUT.

A66. The method of any of paragraphs A63-A65, wherein the DUT height alignment reference point is at least a portion of a/the contact pad of the DUT.

A67. The method of paragraph A66, wherein the DUT height alignment reference point is a top surface of the contact pad.

A68. The method of any of paragraphs A63-A67, wherein the threshold height variation is less than 0.5 µm (micrometers), less than 1 µm, less than 1.5 µm, less than 2 µm, less than 5 µm, and/or less than 10 µm.

A69. The method of any of paragraphs A63-A68, wherein the threshold height variation is less than 1% of a/the maximum linear dimension of a/the contact pad, less than 2% of the maximum linear dimension of the contact pad, less than 5% of the maximum linear dimension of the contact pad, less than 10% of the maximum linear dimension of the contact pad, less than 20% of the maximum linear dimension of the contact pad, and/or less than 50% of the maximum linear dimension of the contact pad.

A70. The method of any of paragraphs A1-A69, wherein the determining the planar offset includes determining a plurality of provisional planar offsets of a corresponding plurality of planar offset fiducials prior to the adjusting the planar location.

A71. The method of paragraph A70, wherein, when the plurality of provisional planar offsets includes an outlier provisional planar offset, the adjusting the planar location is based, at least in part, on a subset of the plurality of provisional planar offsets that excludes the outlier provisional planar offset.

A72. The method of any of paragraphs A70-A71, wherein, when the plurality of provisional planar offsets includes an/the outlier provisional planar offset, the method further includes repeating the maintaining the planar alignment without performing the adjusting the planar location.

A73. The method of any of paragraphs A1-A72, wherein the determining the height offset includes determining a plurality of provisional height offsets of the height offset fiducial prior to the adjusting the height location.

A74. The method of paragraph A73, wherein the determining the plurality of provisional height offsets includes repeatedly and sequentially determining the height offset of the height offset fiducial.

A75. The method of any of paragraphs A73-A74, wherein, when the plurality of provisional height offsets includes an outlier provisional height offset, the adjusting the height location is based, at least in part, on a subset of the plurality of provisional height offsets that excludes the outlier provisional height offset.

A76. The method of any of paragraphs A73-A75, wherein, when the plurality of provisional height offsets includes an/the outlier provisional height offset, the method further includes repeating the maintaining the height alignment without performing the adjusting the height location.

A77. The method of any of paragraphs A1-A76, wherein the comparing the initial image and the subsequent image includes utilizing a pattern recognition routine.

A78. The method of any of paragraphs A1-A77, wherein the comparing the initial height reference and the subsequent height reference includes utilizing a pattern recognition routine.

A79. The method of any of paragraphs A1-A78, wherein the method further includes, prior to the changing the temperature of the DUT, preliminarily aligning the probe head and the DUT.

A80. The method of any of paragraphs A1-A79, wherein the probe is a needle probe.

A81. The method of any of paragraphs A1-A80, wherein the probe forms at least a portion of a probe card.

A82. The method of any of paragraphs A1-A81, wherein the method further includes simultaneously maintaining alignment between a plurality of probes and a corresponding plurality of DUTs.

B1. A probe system configured to test a device under test (DUT), the probe system comprising:
    a chuck that defines a support surface configured to support a substrate that includes the DUT;
    a probe head assembly, wherein the probe head assembly includes a probe configured to contact a corresponding contact pad of the DUT;
    a substrate thermal module configured to regulate a temperature of the substrate; and
    a controller programmed to execute the method of any of paragraphs A1-A82.

B2. The probe system of paragraph B1, wherein the probe system further includes a/the planar offset adjustment structure configured to at least one of:
    (i) translate at least a portion of the probe head assembly in a direction that is at least substantially parallel to the surface plane; and
    (ii) translate at least a portion of the substrate in a direction that is at least substantially parallel to the surface plane.

B3. The probe system of paragraph B2, wherein the planar offset adjustment structure includes at least one of:
    (i) a substrate translation structure configured to translate the substrate relative to the probe head assembly; and
    (ii) a probe head assembly translation structure configured to translate the probe head assembly relative to the substrate.

B4. The probe system of any of paragraphs B1-B3, wherein the probe system further includes a/the height offset adjustment structure configured to at least one of:
    (i) translate at least a portion of the probe head assembly along the contacting axis; and
    (ii) translate at least a portion of the substrate along the contacting axis.

B5. The probe system of paragraph B4, wherein the height offset adjustment s e includes at least one of:
    (i) a/the substrate translation structure configured to translate the substrate relative to the probe head assembly; and
    (ii) a/the probe head assembly translation structure configured to translate the probe head assembly relative to the substrate.

B6. The probe system of any of paragraphs B1-B5, wherein the probe system further includes an optical assembly that is configured to perform an optical measurement of at least a portion of the probe head assembly and/or at least a portion of the substrate.

B7. The probe system of paragraph B6, wherein the optical assembly includes an optical microscope configured to receive an image of the surface of the substrate.

B8. The probe system of any of paragraphs B6-B7, wherein the optical assembly includes a laser interferometer module configured to measure a height offset associated with at least one of at least a portion of the probe head assembly and at least a portion of the substrate by measuring an electromagnetic interference pattern generated by a laser.

B9. The probe system of any of paragraphs B1-B8, wherein the probe head assembly includes at least one optically transparent region, wherein the optically transparent region is configured to permit a/the optical assembly to perform an/the optical measurement of at least a portion of the probe head assembly and/or at least a portion of the substrate when the probe head assembly is positioned above the substrate.

C1. Non-transitory computer readable storage media including computer-executable instructions that, when executed, direct a probe system to perform the method of any of claims A1-A82.

INDUSTRIAL APPLICABILITY

The systems and methods disclosed herein are applicable to the semiconductor manufacturing and test industry.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method of maintaining alignment between a probe, which forms a portion of a probe head assembly, and a device under test (DUT), which is present on a surface of a substrate, during thermal modulation of the DUT, the method comprising:
collecting an initial image of a planar offset fiducial;
determining an initial height reference of a height offset fiducial;
changing a temperature of the DUT from a first DUT temperature to a second DUT temperature;
subsequent to the collecting and during the changing, maintaining a planar alignment between the probe and the DUT by automatically and repeatedly:
(i) collecting a subsequent image of the planar offset fiducial;
(ii) comparing the initial image and the subsequent image to determine a planar offset of the planar offset fiducial, wherein the planar offset is defined within a surface plane that is at least substantially parallel to the surface of the substrate; and
(iii) adjusting a planar location of at least one of the probe and the DUT to maintain the planar alignment, wherein the adjusting is based, at least in part, on the planar offset; and
subsequent to the determining and during the changing, maintaining a height alignment between the probe and the DUT by automatically and repeatedly:
(i) determining a subsequent height reference of the height offset fiducial;
(ii) comparing the initial height reference and the subsequent height reference to determine a height offset of the height offset fiducial, wherein the height offset is defined along a contacting axis that is at least substantially perpendicular to the surface of the substrate; and
(iii) adjusting a height location of at least one of the probe and the DUT to maintain the height alignment, wherein the adjusting is based, at least in part, on the height offset.

2. The method of claim 1, wherein the method further includes generating a planar offset correction signal based, at least in part, on the planar offset, wherein the planar offset correction signal includes an instruction to translate the planar offset fiducial by a planar translation component, wherein the planar translation component has a magnitude that is substantially equal to a magnitude of the planar offset and a direction that is substantially opposed to a direction of the planar offset, and further wherein the adjusting the location of the planar offset fiducial includes planarly translating at least one of the probe and the DUT by the planar translation component and in a direction that is parallel to the surface plane.

3. The method of claim 2, wherein the generating the planar offset correction signal includes generating with an automated controller.

4. The method of claim 2, wherein the method further includes providing the planar offset correction signal to a planar offset adjustment structure, and further wherein the adjusting the location of the planar offset fiducial includes adjusting with the planar offset adjustment structure based, at least in part, on the planar offset correction signal.

5. The method of claim 1, wherein the method further includes generating a height offset correction signal based, at least in part, on the height offset, wherein the height offset correction signal includes an instruction to translate the height offset fiducial by a height translation component, wherein the height translation component has a magnitude that is substantially equal to a magnitude of the height offset and a direction that is substantially opposed to a direction of the height offset, and further the adjusting the location of the height offset fiducial includes translating at least one of the probe head and the DUT by the height translation component and along the contacting axis.

6. The method of claim 5, wherein the generating the height offset correction signal includes generating with an automated controller.

7. The method of claim 5, wherein the method further includes providing the height offset correction signal to a height offset adjustment structure, and further wherein the adjusting the location of the height offset fiducial includes adjusting with the height offset adjustment structure based, at least in part, on the height offset correction signal.

8. The method of claim 1, wherein comparing the initial image and the subsequent image includes comparing a difference between a location of the planar offset fiducial in the initial image and a location of the planar offset fiducial in the subsequent image as measured in a direction that is parallel to the surface plane.

9. The method of claim 1, wherein the collecting the initial image and the collecting the subsequent image include collecting with an optical assembly.

10. The method of claim 1, wherein the collecting the initial image and the collecting the subsequent image include collecting images that provide spatial information relating to motion of the planar offset fiducial in a direction that is parallel to the surface plane.

11. The method of claim 1, wherein the height offset is a distance between the initial height reference and the subsequent height reference as measured along the contacting axis.

12. The method of claim 1, wherein the determining the initial height reference and the determining the subsequent height reference are performed with an optical assembly.

13. The method of claim 1, wherein the changing the temperature includes changing such that the first DUT temperature and the second DUT temperature differ by at least 50° C.

14. The method of claim 1, wherein the method further includes contacting the DUT with the probe.

15. The method of claim 14, wherein the contacting is performed prior to the changing the temperature, and further wherein the maintaining the planar alignment and the maintaining the height alignment include maintaining contact between the probe and the DUT during the changing the temperature of the DUT.

16. The method of claim 1, wherein:
(i) the maintaining the planar alignment between the probe and the DUT includes maintaining the planar alignment between a probe planar alignment reference point and a DUT planar alignment reference point to within a threshold planar alignment variation; and
(ii) the maintaining the height alignment between the probe and the DUT includes maintaining the height alignment between a probe height alignment reference point and a DUT height alignment reference point, as measured along the contacting axis, to less than a threshold height variation.

17. A probe system configured to test a device under test (DUT), the probe system comprising:
an optical assembly;
a chuck that defines a support surface configured to support a substrate that includes the DUT;
a probe head assembly, wherein the probe head assembly includes a probe configured to contact a corresponding contact pad of the DUT;
a substrate thermal module configured to regulate a temperature of the substrate; and
a controller programmed to execute the method of claim 1, wherein the controller further is programmed to:
i) perform the collecting the initial image and the collecting the subsequent image utilizing the optical assembly;
(ii) perform the changing the temperature of the DUT utilizing the substrate thermal module; and
(iii) perform the adjusting the planar location and the adjusting the height location by adjusting a relative orientation between the probe head assembly and the chuck.

18. The probe system of claim 17, wherein the probe system further includes a planar offset adjustment structure and a communication linkage extending between the controller and the planar offset adjustment structure, and further wherein the planar offset adjustment structure is configured to at least one of:
(i) translate at least a portion of the probe head assembly in a direction that is at least substantially parallel to the surface plane based, at least in part, on the planar offset; and
(ii) translate at least a portion of the substrate in a direction that is at least substantially parallel to the surface plane based, at least in part, on the planar offset.

19. The probe system of claim 17, wherein the probe system further includes a height offset adjustment structure and a communication linkage extending between the controller and the height offset adjustment structure, and further wherein the height offset adjustment structure is configured to at least one of:
(i) translate at least a portion of the probe head assembly along the contacting axis based, at least in part, on the height offset; and
(ii) translate at least a portion of the substrate along the contacting axis based, at least in part, on the height offset.

20. Non-transitory computer readable storage media including computer-executable instructions that, when executed, direct a probe system to perform the method of claim 1.

* * * * *